United States Patent [19]

Laroia

[11] Patent Number: 5,488,633
[45] Date of Patent: Jan. 30, 1996

[54] INTERSYMBOL INTERFERENCE CHANNEL CODING SCHEME

[75] Inventor: Rajiv Laroia, Bridgewater, N.J.

[73] Assignee: AT&T Corp., Murray Hill, N.J.

[21] Appl. No.: 76,603

[22] Filed: Jun. 14, 1993

[51] Int. Cl.[6] .............................. H04L 5/12; H04L 25/34
[52] U.S. Cl. .............. 375/262; 375/341; 371/43
[58] Field of Search ............................ 371/43; 375/39, 375/18, 296

[56] References Cited

U.S. PATENT DOCUMENTS

| | | | |
|---|---|---|---|
| 5,040,191 | 8/1991 | Forney | 375/39 |
| 5,150,381 | 9/1992 | Forney | 375/39 |
| 5,159,610 | 10/1992 | Eyuboglu | 375/18 |
| 5,195,107 | 3/1993 | Wei | 375/18 |
| 5,388,124 | 2/1995 | Laroia | 375/17 |
| 5,396,519 | 3/1995 | Betts | 375/296 |

OTHER PUBLICATIONS

Motorola Information Systems Contribution to CCITT Standards Mtg. on V.FAST Standard, Jan. 1992.
R. Laroia, et al., "A Simple & Effective Precoding Scheme . . ." *IEEE Trans. on Communicationa*, vol. 41, No. 10, Oct. 1993.
R. Laroia, "On Optimal Shaping of Multidimensional Constellations . . . ", *U. of Maryland TR 92–1, Jan. 1992, Technical Research Report*.
General DataComm, Inc. Contribution to CCITT Standards Mtg. on V.FAST Standard, Jan. 1992.

*Primary Examiner*—Sandra L. O'Shea
*Assistant Examiner*—John Ning
*Attorney, Agent, or Firm*—Gerald A. deBlasi; Joseph J. Opalach

[57] ABSTRACT

Intersymbol interference and precoding loss are minimized by combining the precoding and coding operations. An intersymbol interference coder uses a feedback loop to apply a dither sequence to a sequence of input signal points. The dither signal applied to each input signal point is a function of the previous signal points in the sequence. The intersymbol interference coder implements, for example, a trellis coding operation by selecting one of several different modulo operations to determine the magnitude of the dither signal, the selection being made in response to the current trellis state. The sequence of signal points output from the intersymbol interference coder generates a valid sequence of the trellis code input to the Viterbi decoder.

17 Claims, 4 Drawing Sheets

INTERSYMBOL INTERFERENCE CHANNEL CODING SCHEME

FIELD OF THE INVENTION

This invention relates to methods for transmitting data over intersymbol interference channels and, more particularly, to methods for minimizing the effects of intersymbol interference on transmitted data.

BACKGROUND OF THE INVENTION

Intersymbol interference results from the fact that a typical communications channel inherently has memory such that other signals transmitted through the channel interfere with the current, transmitted signal. Prior techniques for minimizing the effects of intersymbol interference have involved "precoding" the signal to be transmitted. These prior art techniques, while allowing both coding and shaping gains on intersymbol interference channels, provide sub-optimal performance because of the "precoding loss" (i.e., the additional power that must be transmitted to minimize the effects of intersymbol interference) associated with these techniques. Because the precoding loss increases whin a more powerful trellis code is used, such precoders cannot approach the channel capacity.

One technique for minimizing the effects of intersymbol interference involves precoding a sequence of signal points to achieve noise whitening on intersymbol interference channels. This precoding is a nonlinear operation that ensures that the channel output or the output of a noise whitening filter is a trellis code sequence affected by additive white Gaussian noise. A so-called "dither signal" is added to each of the signal points in the sequence.. No coding operation (i.e., an operation which achieves coding gain) is performed as part of precoding. Rather, precoding is performed on a sequence of previously trellis coded signal points which could be selected from a shaped constellation. Precoding is performed by using a modulo $\lambda'$, operation, where $\lambda'$ is the coset lattice, that is, the lattice in the last level of coset partitioning used to generate the trellis code. Using this scheme, the precoding loss is large when the trellis code is based on a large number of coset partitions. The performance of this scheme degrades with the number of coset partitions used to generate the trellis code.

SUMMARY OF THE INVENTION

Intersymbol interference and precoding loss are minimized in accordance with the invention by combining the precoding and coding operations. By performing precoding together with coding, the nonlinear modulo operation is based on the first level of the lattice partitioning used to generate the trellis code. This produces a smaller precoding loss than the prior art precoding techniques and makes the precoding loss independent of the number of coset partitions used to generate the trellis code. Coding is performed by choosing the appropriate nonlinear modulo operation as a function of the current state of the finite-state machine that is used to generate the trellis code.

In an exemplary embodiment of the invention, an intersymbol interference coder uses a feedback loop to apply a dither sequence to a sequence of uncoded input signal points. The dither signal applied to each input signal point is a nonlinear function of the previous signal points in the sequence and the current state of the finite-state machine used to generate the trellis code. The intersymbol interference coder implements, for example, a trellis code by selecting one of two different modulo (mod) operations to determine the magnitude of the dither signal, the selection being made based on the current state of the finite-state machine used to generate the trellis code.

DETAILED DESCRIPTION

Figure 1:
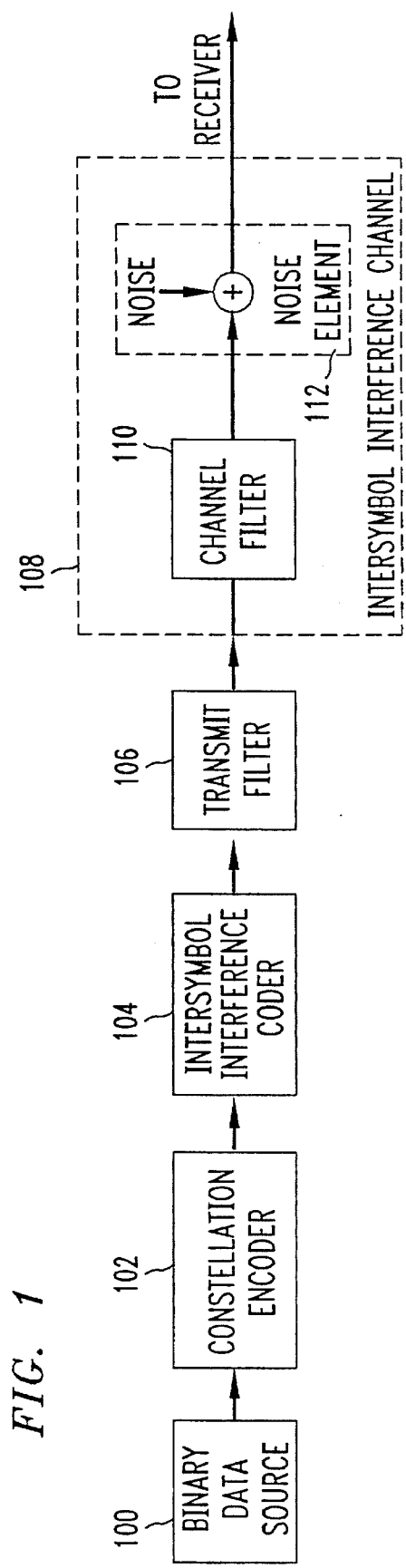
FIG. 1 is a block diagram of the transmitter portion of a communications system constructed in accordance with the principles of the present invention.

FIG. 1 shows the transmitter portion of a communications system which includes an intersymbol interference channel. The transmitter includes a binary data source 100, a constellation encoder 102, an intersymbol interference coder 104, and a transmit filter 106. The transmitter outputs a sequence of signal points for transmission across an intersymbol interference channel 108. Intersymbol interference channel 108 can be represented as an intersymbol interference channel filter 110 and noise applied to an adder (which is diagramatically represented as a noise element 112).

Binary data source 100 outputs data in the form of bits to constellation encoder 102, which maps the bits received from data source 100 to a sequence of signal points selected from a shaped, but uncoded, constellation. Constellation encoder 102 outputs a stream of signal points to intersymbol interference coder 104. In accordance with the invention, intersymbol interference coder 104 adds, as described below, a dither sequence to the stream of signal points to generate an output sequence of signal points that (1) is precoded to minimize the effect of intersymbol interference, and (2) in the receiver, results in a sequence from a predetermined signal-space code (e.g., a trellis code) affected by white Gaussian noise (to achieve coding gain). The output sequence of signal points is passed through a conventional transmit filter 106 and applied to intersymbol interference channel 108.

Figure 2:
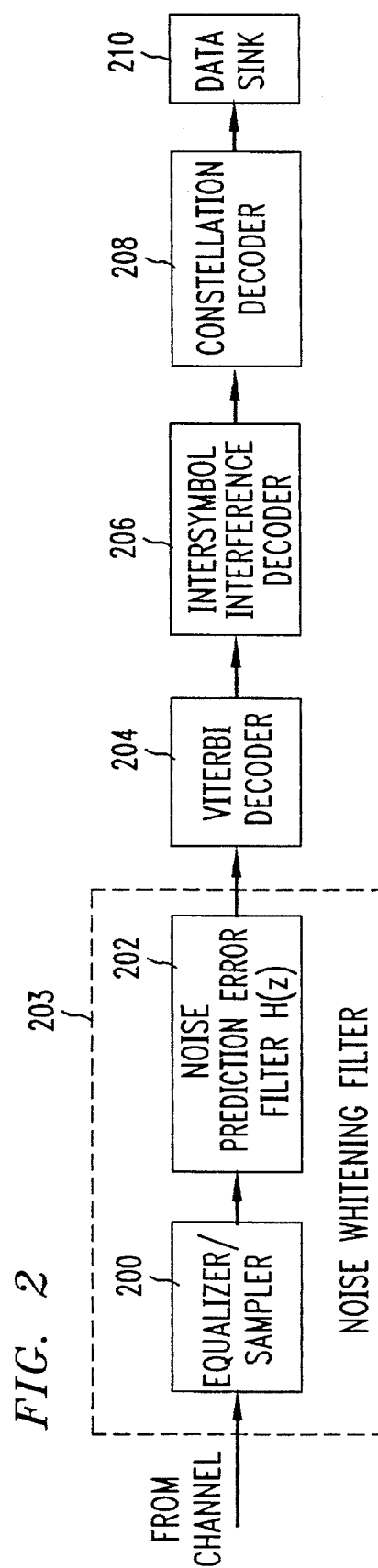
FIG. 2 is a block diagram of the receiver portion of a communications system constructed in accordance with the principles of the present invention.

FIG. 2 shows the receiver portion of the communications system, which receives a sequence of signal points from intersymbol interference channel 108. The receiver includes an equalizer/sampler 200 and a noise prediction error filter 202 which collectively comprise a "noise whitening" filter 203, a Viterbi decoder 204, an intersymbol interference decoder 206, a "constellation" decoder 208, and a data sink 210. Noise prediction error filter 202 has a transfer function H(z). Equalizer/sampler 200, noise prediction error filter 202, Viterbi decoder 204, and constellation decoder 208 can be implemented in a conventional manner that is known to those skilled in the art.

The output of intersymbol interference channel 108 is input to equalizer/sampler 200 and noise prediction error filter 202 which output the sequence to Viterbi decoder 204. Alternatively, the output of channel 108 can provided directly to Viterbi decoder 204 (in which case, channel filter 110 has a transfer function H(z)). The output of intersymbol interference channel 108 (or the output of noise prediction error filter 202 if used in the noise whitening context) is a sequence from the predetermined signal-space code affected by noise, such as white Gaussian noise. Viterbi decoder 204 is a maximum likelihood-type detector which operates to identify the sequence of signal points and effectively removes this noise. The transmitted constellation point is then uniquely recovered from the output of Viterbi decoder 204 by intersymbol interference decoder 206, as described below in the discussion of FIG. 5. Constellation decoder 208 receives a sequence of signal points from intersymbol interference decoder 206 and outputs bits, which blocks of signal points, to data sink 210.

Figure 3:
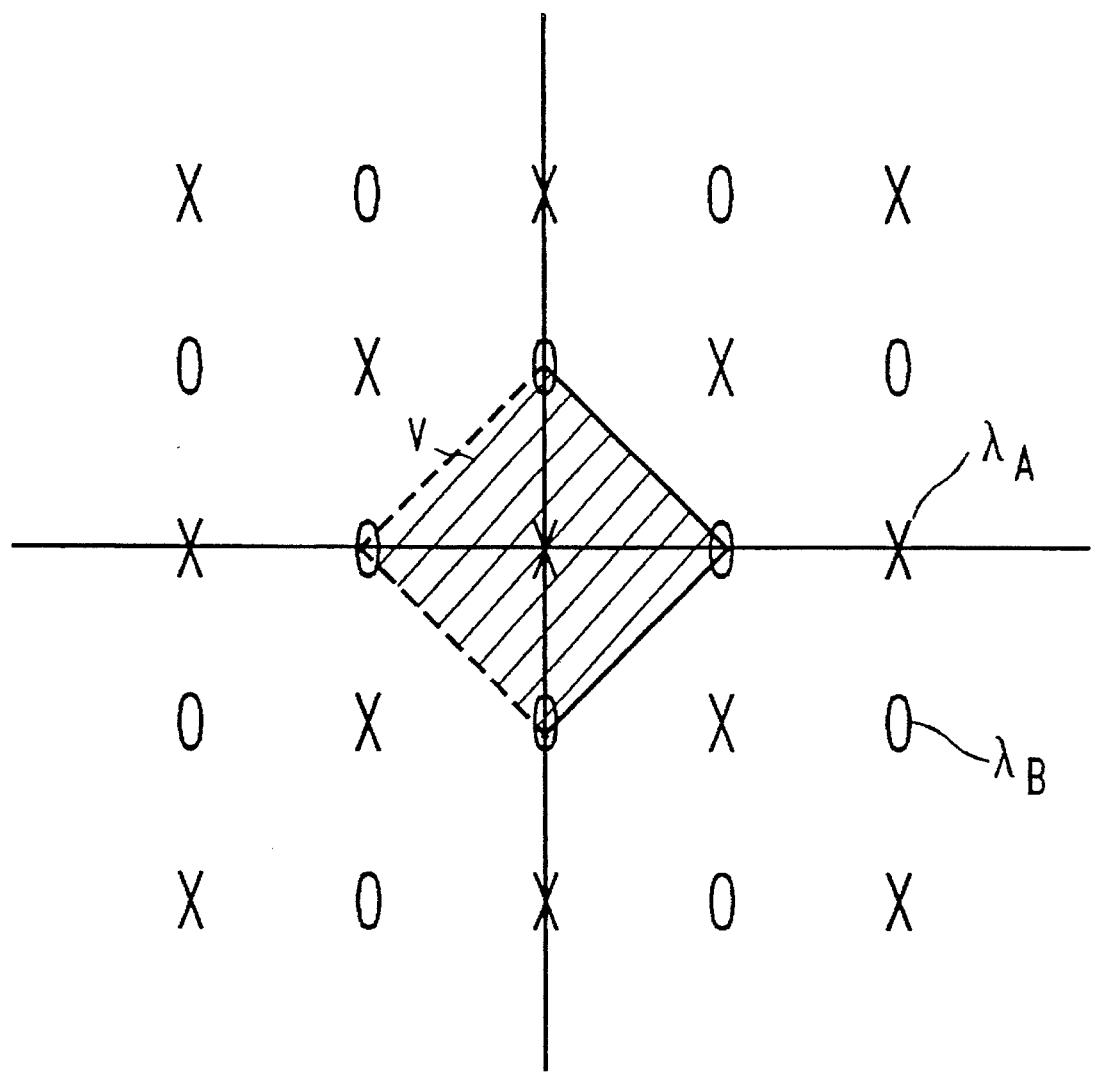
FIG. 3 shows the first level of partitioning of a two-dimensional lattice that may be used to generate a trellis code in accordance with the invention.

To generate the trellis code, a two-dimensional (2D) lattice $\lambda = Z^2$ is partitioned into cosets of the coset lattice $\lambda'$, which is a sublattice of $Z^2$. (The notation "$Z^2$" indicates that both coordinates of all points on a plane are integers.) FIG. 3 shows the 2D lattice $\lambda$ that in the first level of partitioning is partitioned into two subsets $\lambda_A$ and $\lambda_B$. For this example $\lambda_A = RZ^2$ and its coset (in $\lambda$) $\lambda_B = RZ^2 + (0,1)$ represent the first level of partitioning, i.e., $\lambda/\lambda_a/\lambda'$ from a chain of lattice partitions. Points on the lattice $\lambda$ identified by "x" and "o", respectively represent points from subsets $\lambda_A$ and $\lambda_B$. For all coset codes with redundancy 1 bit/2D, all outgoing transitions from any trellis state either correspond to signal points in $\lambda_A$ or signal points in $\lambda_B$, but not in both. The output of constellation encoder 102 (FIG. 1) is an uncoded sequence of points on $\lambda_A$.

At the origin of the lattice in FIG. 3 is a region identified by the letter V (shown as a shaded region). This region is the Voronoi region of the lattice $\lambda_A$. The Voronoi region contains all points on the plane which are closer to the origin than to any other point on the lattice. The Voronoi region is bounded on two sides by solid lines, indicating that the signal points along those lines are included in the region. The remaining two sides of the Voronoi region are bounded by dashed lines, indicating that the signal points along those lines are excluded from the region. The significance of the Voronoi region will be made clear below.

In accordance with the present invention, the operations of a) trellis coding to provide coding gain and b) precoding to overcome the effects of intersymbol interference, are combined into a single operation. The intersymbol interference coder of the invention is used to transmit data over intersymbol interference channels while realizing both coding and shaping gains. By combining trellis coding and precoding in a single operation, the invention achieves a smaller precoding loss than was possible in the prior art. Also, the precoding loss of the intersymbol interference coder of the invention is independent of the number of coset partitions used to generate the trellis code.

Figure 4:
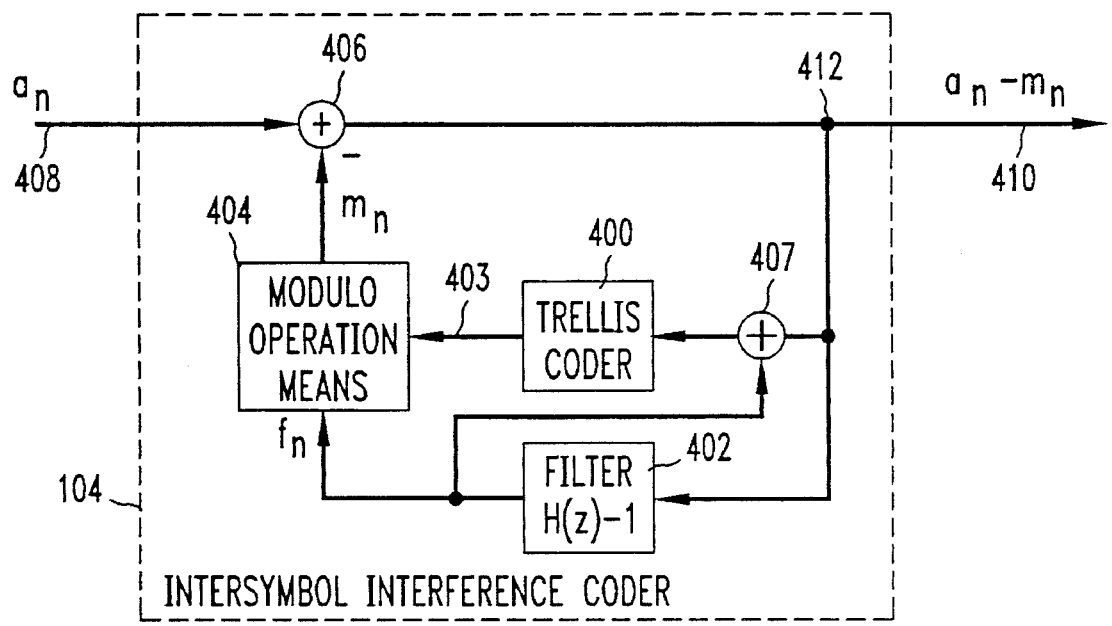
FIG. 4 is a block diagram of the intersymbol interference coder of FIG. 1.

FIG. 4 shows a block diagram of intersymbol interference coder 104. Intersymbol interference coder 104 includes a trellis coder 400, a filter 402, modulo operation means 404, and adders 406 and 407. As discussed above, intersymbol interference coder 104 receives a signal point on lead 408 and outputs the signal point for transmission over intersymbol interference channel 108 on lead 410. Filter 402, modulo operation means 404, and adder 406 form a feedback loop between a node 412 at the output of intersymbol interference coder 104 and adder 406. With the intersymbol interference coder 104, the output of noise prediction error filter 202 will be $a_n + q_n$ affected by white Gaussian noise, where $q_n$ is a point on either $\lambda_A$ or $\lambda_B$. The output of filter 402 also is applied to adder 407 to be added to the signal from node 412 to form the input to trellis coder 400.

Filter 402 has a transfer function H(z)-1, giving intersymbol interference coder 104 an effective transfer function of 1/H(z) if the modulo operation is ignored (i.e., replaced by a simple connection). Thus, ignoring the operation of modulo operation means 404, intersymbol interference coder 104 would have a transfer function that is the reciprocal of the transfer function of noise prediction error filter 202.

In accordance with the invention, intersymbol interference coder 104 ensures that the input to Viterbi decoder 204 is the trellis code sequence $a_n + q_n$ affected by additive white Gaussian noise. This is accomplished by selecting the appropriate mod operation in modulo operation means 404. Coder 104 selects the appropriate mod operation based on the current state of the finite-state machine which generates the trellis code. If the current state dictates that the present output be in $\lambda_A$, modulo $\lambda_A$ operation is selected. If, on the other hand, the current state requires the output to be in $\lambda_B$, modulo $\lambda_B$ is selected. After the modulo operation, the output $a_n + q_n$ of noise prediction error filter 202 (assuming no noise) is used to determine the next state of the finite-state machine.

Trellis coder 400 is a finite state machine which generates the trellis code. Trellis coder 400 deals with all levels of partitioning of the trellis code, but mod operations are based only on the first level of trellis partitioning.

To understand why the output of noise whitening filter 203 is a valid sequence from a trellis code, consider the following. Assume that the past sequence of output signal points ..., $a_0 + q_0$, ..., $a_{n-2} + q_{n-2}$, $a_{n-1} + q_{n-1}$ form a valid trellis sequence. If the output $a_{n-1} + q_{n-4}$ leaves the trellis in a state that allows only those transitions that correspond to points in $\lambda_A$, trellis coder 400 selects mod $\lambda_A$ operation. If instead, however, $a_{n-1} + q_{n-1}$ leaves the trellis in a state that allows only those transitions that correspond to points in $\lambda_B$, trellis coder 400 selects mod $\lambda_B$ operation. Performing a mod $\lambda_A$ operation implies, as described below, quantizing the feedback signal $f_n$ to the nearest point $q_n$ in $\lambda_A$ and determining the quantization error $m_n$. Similarly, a mod $\lambda_B$ operation refers to quantizing $f_n$ to the nearest point $q_n$ in $\lambda_B$ and determining the quantization error $m_n$.

The quantization in the modulo operation means 404 is performed such that the error $m_n$ (the dither signal that is applied to adder 406) is always a point in the Voronoi region V of $\lambda_A$. Since the current input signal point on lead 408 is always a point in $\lambda_A$ (signal points $a_n$ are selected from an uncoded constellation), $a_n + q_n$ corresponds to a valid transition in the finite-state machine of the trellis code, taking the finite-state machine to a new state. This process is continually repeated for successive next inputs (e.g., $a_{n+1}$). In this manner, intersymbol interference coder 104 ensures that the input to the Viterbi decoder in the receiver is a valid trellis sequence (affected by additive white Gaussian noise).

As discussed above, the precoding loss is the overhead transmitted energy required to overcome the effects of intersymbol interference caused by channel 108. In the embodiment of FIG. 4, the precoding loss is the average energy of $m_n$, which is the average energy of the Voronoi region V of the lattice $\lambda_A$. By combining the precoding operation, that is, the addition of a dither sequence (a sequence of successive dither signals $m_n$) to the sequence of input channel signal points, with the coding operation, intersymbol interference coder 104 performs modulo operations based on sublattices in the first level of lattice partition used to generate the trellis code. The sublattices in the first level partition are more dense (finer) than later partitions of the lattice. Hence, the lattice corresponding to the first level partition has a smaller Voronoi region than that of the lattices corresponding to later partitions, and thus, has a smaller average energy. This produces a smaller precoding loss. Operating on the first level partition also makes the precoding loss independent of the number of coset partitions that generate the trellis code.

Intersymbol interference coder 10.4 will operate successfully if the sequence of signal points $a_n$ can be uniquely recovered from the output $\hat{a}_n + \hat{q}_n$ of Viterbi decoder 204. The symbol $\hat{a}_n + \hat{q}_n$ denotes an estimate of the quantity $a_n + q_n$.) Intersymbol interference decoder 206, shown in greater detail in FIG. 5, performs this decoding operation.

Figure 5:
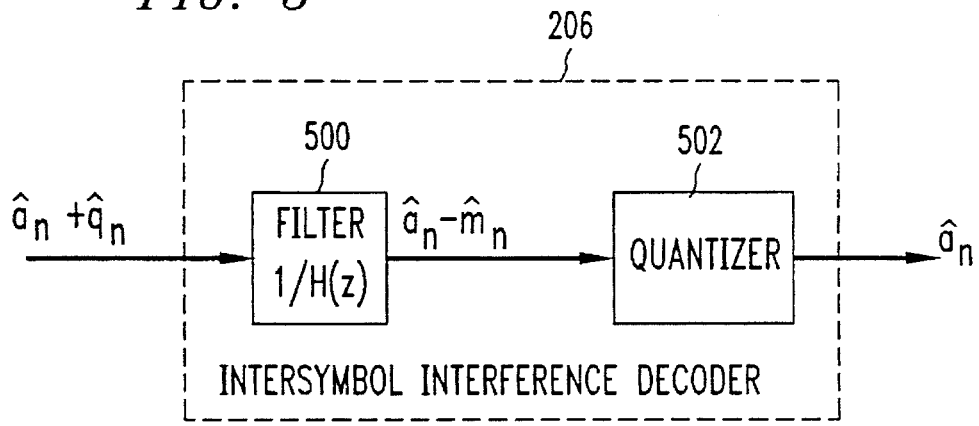
FIG. 5 is a block diagram of the intersymbol interference decoder of FIG. 2.

Referring to FIG. 5, intersymbol interference decoder 206 includes a filter 500 and a quantizer 502. Filter 500 has a transfer function $1/H(z)$ which is the inverse of the transfer function of noise prediction error filter 202. In the absence of channel errors, filter 500 receives a signal point having a value $a_n + q_n$ from the output of the Viterbi decoder 204. The sequence $a_n + q_n$ is filtered by filter 500 to give a signal $a_n - m_n$. Because $m_n$ is always in the Voronoi region V of the lattice $\lambda_A$, and $a_n$ is a point on $\lambda_A$, quantizer 502 can recover $a_n$ from $a_n - m_n$ simply by quantizing, in a conventional manner, to the nearest point in lattice $\lambda_A$ (such that the quantization error is within Voronoi region V).

Intersymbol interference coder 104 has been described in the context of receiving a sequence of signal points which are selected from an uncoded constellation. It is to be understood, however, that intersymbol interference coder 104 could receive signal points encoded using a first trellis code which intersymbol interference coder 104 converts to a different trellis code.

It will be apparent to one skilled in the art that other modifications can be made to the described embodiment without departing from the scope of the invention. For example, although the invention has been described in the context of 2D trellis coded signal points with a 1 bit/2D redundancy, the present invention is equally applicable to trellis codes of other dimensions and redundancies, and to other signal-space codes. Also, unshaped constellations, and constellations of different sizes and different dimensionality could be used.

I claim:

1. A method for transmitting data over an intersymbol interference channel using a predetermined signal-space code, the method comprising the steps of:
   receiving a sequence of input signal points (408) selected from a predetermined constellation of signal points; and
   adding a dither signal to each of the input signal points, the dither signal (406) applied to a present signal point being selected as a function of previous signal points in the sequence and the current state of a finite-state machine (400) used to generate the signal-space code.

2. The invention of claim 1 wherein the predetermined constellation of signal points comprises a shaped constellation.

3. The invention of claim 1 wherein the predetermined constellation of signal points comprises a shaped, trellis-coded constellation.

4. The invention of claim 1 wherein the signal-space code comprises a trellis code.

5. The invention of claim 4 wherein the trellis code is based on partitioning of a lattice, and the dither signal is a point within a Voronoi region of a sub-lattice in the first level of lattice partitioning used to generate the trellis code.

6. A method for transmitting data over an intersymbol interference channel, the method comprising the steps of:
   partitioning a constellation of signal points into a first group of subsets;
   partitioning each of the subsets in the first group of subsets into at least two subsets;
   generating a sequence of input signal points (102) selected from the constellation; and
   adding a dither signal (406) to each of the input signal points, the dither signal applied to a present signal point being a point within a Voronoi region of a subset in the first group of subsets and being a function of a previous signal point in the sequence.

7. Data transmission apparatus for transmitting data using a predetermined signal-space code, comprising:
   means for selecting a sequence of input signal points (102) from a predetermined constellation of signal points; and
   means for adding a dither signal (104) to each of the input signal points, including means for selecting the dither signal applied to a present signal point as a function of the previous signal points in the sequence and the current state of a finite-state machine (400) used to generate the signal-space code.

8. The invention of claim 7 wherein the predetermined constellation of signal points comprises a shaped constellation.

9. The invention of claim 7 wherein the predetermined constellation of signal points comprises a shaped, trellis-coded constellation.

10. The invention of claim 7 wherein the signal-space code comprises a trellis code.

11. The invention of claim 10 wherein the trellis code is based on a lattice, and the means for selecting the dither signal selects a point within a Voronoi region of the lattice in the first level of partitioning used to generate the trellis code.

12. A method for transmitting data over an intersymbol interference channel using a predetermined signal-space code, the method comprising the steps of:
   receiving a stream of input data (102); and
   generating a sequence of coded signal points (406, 410) of the signal-space code, the current point of the signal space code is a function of selected data from said stream of input data and the current output of a finite-state machine,
   wherein the current input to the finite-state machine is derived from a previously generated signal point of the signal-space code.

13. The invention of claim 12 wherein the signal-space code comprises a trellis code.

14. Apparatus for transmitting data over an intersymbol interference channel using a predetermined signal-space code, comprising:
   means for receiving a stream of input data (102);
   a finite-state machine (400) having a current input and generating a current output; and
   means for generating a sequence of coded signal points (406) of the signal-space code, the current point of the signal-space code is a function of selected data from said stream of input data and the current output of a finite-state machine (400), wherein the current input to the finite-state machine is derived from a previously generated signal point of the signal-space code.

15. The invention of claim 14 wherein the signal-space code comprises a trellis code.

16. A method for transmitting data over an intersymbol interference channel to a receiver using a predetermined signal-space code, the method comprising the steps of:

receiving a stream of input signal points (102); and modifying a current input signal point value (104) to generate at an input to a Viterbi decoder in said receiver a current sample of a sequence of the signal-space code, said modifying being performed as a function of a current output of a finite-state machine, the finite-state machine receiving as a current input the previous sample of said sequence of the signal-space code.

17. A method for transmitting data over an intersymbol interference channel using a predetermined trellis code based on partitioning a lattice, the method comprising the steps of:

receiving a sequence of input signal points (408) selected from a predetermined constellation of signal points; and adding a dither signal (408) to each of the input signal points, the dither signal applied to a present signal point being selected as a function of previous signal points in the sequence and being a point within a Voronoi region of a sublattice in a first level of lattice partitioning used to generate the trellis code.

* * * * *